(12) United States Patent
Yun et al.

(10) Patent No.: US 6,333,858 B1
(45) Date of Patent: Dec. 25, 2001

(54) CARRIER MODULE

(75) Inventors: Sang Jae Yun, Kyungki-do; Back Woon Jung, Choongchungnam-do; Ki Hyun Lee, Choongchungnam-do; Ki Hyun Jung, Choongchungnam-do, all of (KR)

(73) Assignee: Mirae Corporation, Choongchungnam-Do (KR)

( * ) Notice: Subject to any disclaimer, the term of this patent is extended or adjusted under 35 U.S.C. 154(b) by 0 days.

(21) Appl. No.: 09/559,581

(22) Filed: Apr. 28, 2000

(30) Foreign Application Priority Data

May 1, 1999 (KR) .................................................. 99-15799
Jun. 1, 1999 (KR) .................................................. 99-21379

(51) Int. Cl.[7] ................................ H05K 7/02; H05K 7/04
(52) U.S. Cl. ........................ 361/807; 361/801; 361/802; 439/447; 439/544
(58) Field of Search .................................. 361/807, 607, 361/610, 609, 801, 732, 802, 759; 439/291, 299, 438, 442, 447, 594; 714/721

(56) References Cited

U.S. PATENT DOCUMENTS

| | | | |
|---|---|---|---|
| 4,786,256 | * 11/1988 | Angeleri et al. | 439/72 |
| 4,789,345 | * 12/1988 | Carter | 439/71 |
| 5,249,972 | * 10/1993 | Walker | 439/72 |
| 5,335,002 | * 8/1994 | Nagahata et al. | 346/76 PH |
| 5,364,284 | * 11/1994 | Tohyama et al. | 439/266 |
| 5,429,523 | * 7/1995 | Tondreault | 439/157 |
| 5,752,846 | * 5/1998 | Abe | 439/266 |
| 5,823,794 | * 10/1998 | Abe | 439/73 |

* cited by examiner

*Primary Examiner*—Jeffrey Gaffin
*Assistant Examiner*—Hung Bui
(74) *Attorney, Agent, or Firm*—Rosenberg, Klein & Lee

(57) ABSTRACT

There is disclosed a carrier module capable of accurately fixing IC device when the producted IC device is tested on the performance thereof. The carrier module includes a body having an insertion groove formed therein in a predetermined direction and holes, an elastic unit inserted and fixed to the insertion groove, for being elastically moved upward and downward, a latch installed on upper portion of the elastic means, for fixing an IC device, and a pin for fixing the latch by being inserted and fixed into the body, wherein the IC device is fixed or released by operation of the latch. The carrier module has a structure permitting the latches to be pressed at both sides thereof, and therefore the present invention provides an easy machining and assembling of the carrier module, and lowers the production cost by reducing the number of parts.

3 Claims, 6 Drawing Sheets

CARRIER MODULE

BACKGROUND OF THE INVENTION

1. Field of the Invention

The present invention relates to a carrier module used for contact operations of various kinds of IC devices, and more particularly to a carrier module capable of accurately fixing the IC device at the time of testing the IC device.

2. Description of the Conventional Art

Conventional carrier modules 2 used in a test handler are adapted to be seated on mounting lugs 3 of a tray 1, as shown in FIG. 1. The carrier module 2 has a IC receiving portion 4 therein for accommodating the IC device 100 therein.

The tray 1 has plural reinforcements 6, inside a rectangular frame 5, arranged at predetermined intervals.

To prevent the displacement of the IC device 100 accommodated in the carrier module 2, the conventional art uses the carrier module 2 having a latch 7 installed at a predetermined position, as shown in FIG. 2.

As shown in FIG. 2, the latch 7 protrudes, integrally with a body 8, from a side surface of the IC receiving portion 8a. A suction means 9 is used to seat the IC device 100 on a predetermined location of the IC receiving portion 8a. When the IC device 100 is seated, the latch 7 fixes the IC device.

On the other hand, to release the IC device 100, a latch releasing mechanism 7a is used to release the latch 7 and then the suction means 9 sucks the released IC device 100.

However, the conventional carrier module thus constructed has drawbacks in that other extra carrier modules are needed to handle individual IC devices different in size and thickness, and further the considerable time for exchanging a carrier module with others suitable for individual IC devices is required.

Moreover, the reliability of the products are reduced due to the scratching or breakage of the IC device caused by the latch, which may occur during the contact between the IC device and the latch.

SUMMARY OF THE INVENTION

Therefore, it is an object of the present invention to provide a carrier module capable of reducing the carrier module exchanging time by constructing the carrier module suitable for various sizes and thicknesses of the IC devices.

Another object of the present invention is to provide a carrier module offering an accurate electric contact between a test socket and leads at a test site, and capable of preventing scratching and breakage of the IC device by a latch of the carrier module.

According to one aspect of the present invention, there is provided a carrier module comprising: a body having an insertion groove formed therein in a predetermined direction and holes; elastic means inserted and fixed to the insertion groove, for being elastically moved upward and downward; a latch installed on upper portion of the elastic means, and for fixing an IC device; and a pin for fixing the latch, by being inserted and fixed into the body, wherein the IC device is fixed or released by operation of the latch.

According to another aspect to the present invention, there is also provided a carrier module comprising: a body having at least one or more guide means; a latch for fixing or releasing IC device which is seated on the body; a connecting piece connected to lower portion of the latch, and adapted to be moved together with the movement of the latch; and a support block to which a predetermined portion of the connecting piece is inserted to be coupled, and configured to move upward or downward the connecting piece by being mutually connected by means of a connecting pin.

DETAILED DESCRIPTION OF THE INVENTION

A carrier module according to the present invention will be described in detail, with reference to the accompanying drawings.

Figure 1:
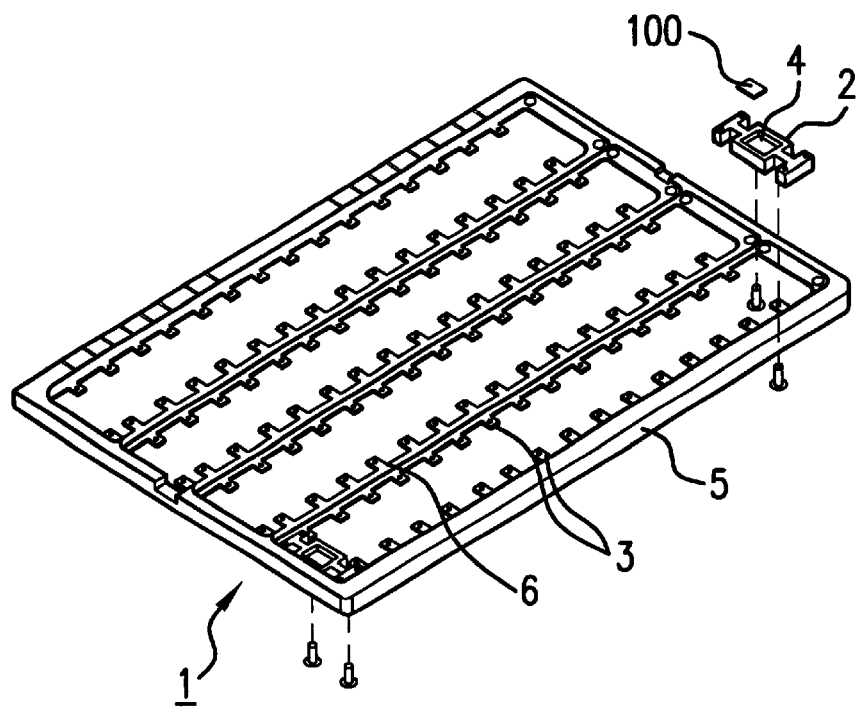
FIG. 1 is a perspective view showing a carrier module applied to a conventional test handler.
Figure 2:
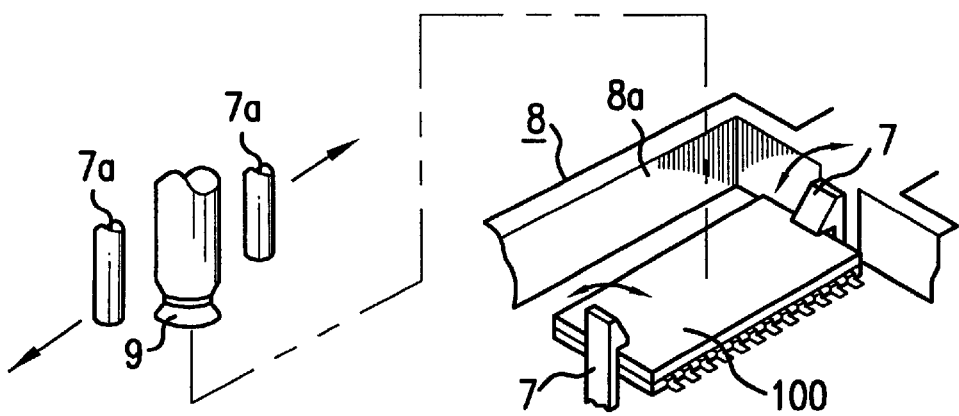
FIG. 2 is a perspective view showing a state where a IC device is fixed in the conventional test handler.
Figure 3:
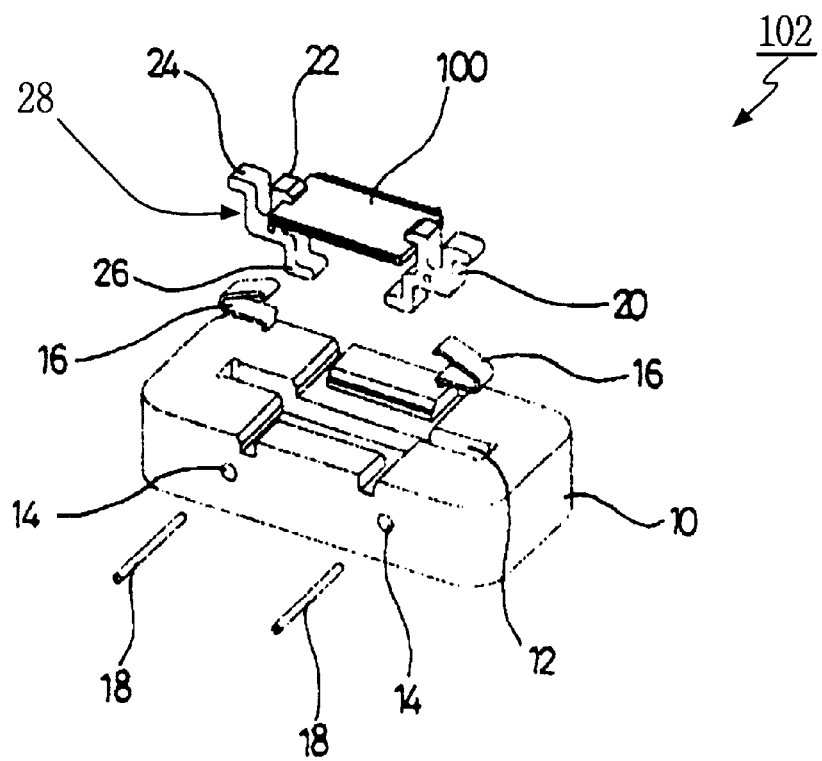
FIG. 3 is an exploded, perspective view of a carrier module according to one embodiment of the present invention.

As shown in FIG. 3, the carrier module 102 according to one embodiment of the present invention includes a hexahedral body 10, springs 16 inserted into a groove 12 which is formed in an upper portion of the body 10, a latch 28 for fixing an IC device 100, and a pin 18 for fixing the latch 28.

The longitudinal groove 12 is formed in the body 10, whose side surface is provided with holes 14 for inserting and fixing the pins 18 and arranged at a predetermined distance. The springs 16, herein implemented by plate springs, are inserted into the groove 12 of the body 10, which springs offer vertical elastic force, respectively. The groove 12 is configured to be formed within the body 10.

Each of the latches 28 is disposed to be seated on a top surface of the spring 16 and is configured to have the pin 18 inserted therethrough, to fix the IC device 100. Further, the pivoting of the latch 28 is permitted by the use of the pins 18 inserted into the holes 14 which are formed in the side surfaces of the body 10.

Figure 4:
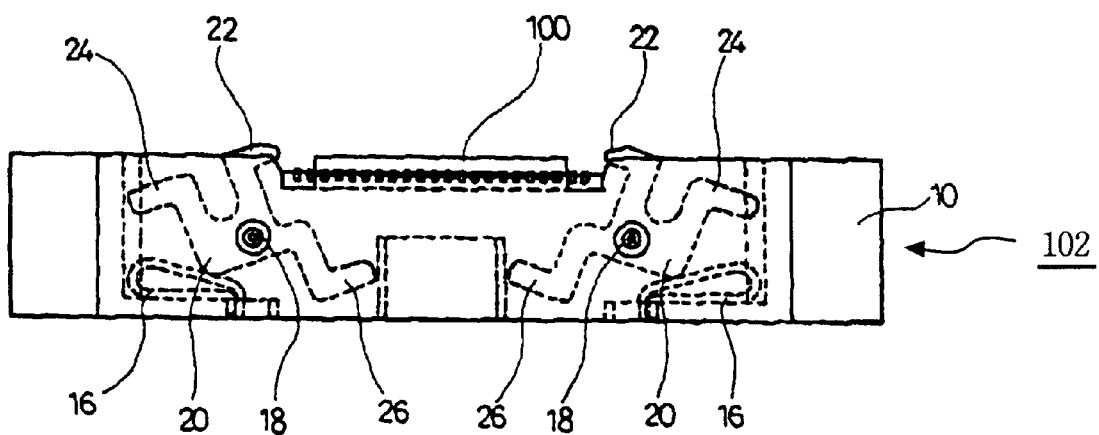
FIG. 4 is a sectional view showing a state before a IC device is fixed to the carrier module according to the present invention.
Figure 5:
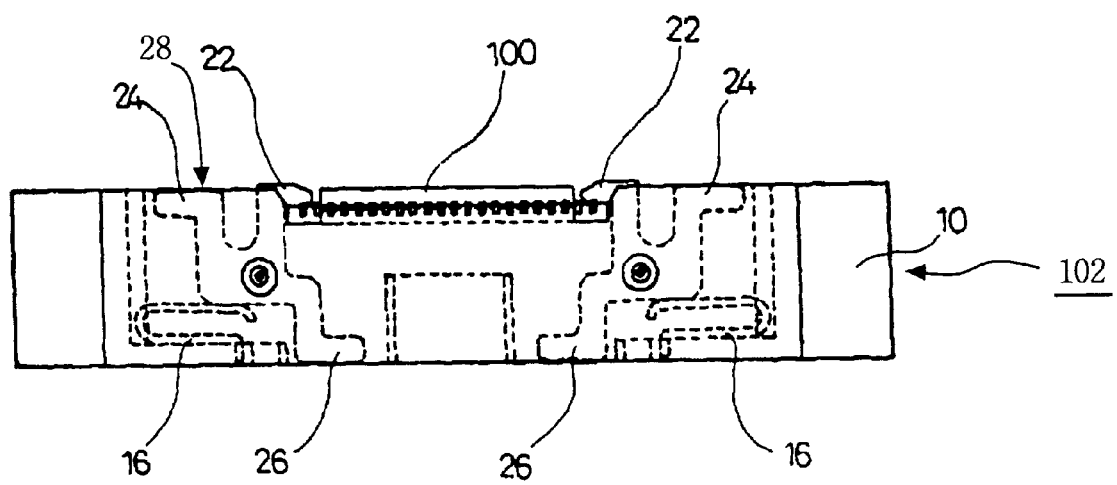
FIG. 5 is a sectional view showing a state where a IC device is fixed to the carrier module according to the present invention.

As shown in FIGS. 3 to 5, each latch 28 has a jaw 22 for being in contact with the IC device 100 to fix it to the body 10, an upper button 24 behind the jaw is connected thereto, and a lower button 26 is formed underneath the jaw 22. The upper and lower buttons 24 and 26 of the latch 28 have respective upper and lower rounded surfaces, as shown in FIG. 3.

FIG. 4 is a side view of FIG. 3, and shows a step before the IC device 100 is fixed, and FIG. 5 shows a step after the IC device 100 is fixed.

For the carrier module 102 according to one embodiment of the present invention, prior to the fixing of IC device 100, the latches 28 maintain an opened state. At this time, the latch 28 elastically presses against a predetermined end portion of the spring 16. It is noted that the upper and lower buttons 24, 26 of the latch 28 are configured to have their surfaces rounded in order to reduce a friction during the contact with other parts.

To seat the IC device 100, an upward movement of the spring 16 is made to push up the latch 28, this operation permitting the right and left jaws 22 thereof to fix the IC device 100 thereat. That is, as shown in FIG. 5, the IC device 100 can tightly be fixed by the jaws 22 of the latches 28.

On the other hand, after fixing the IC device 100 as shown in FIG. 5, it may be needed to release the IC device again. To this end, the selective press action on the upper and lower buttons 24, 26 may be taken to release an remove the IC device 100.

The latch 28 serves as a support in the inside wall of the body 10, and also as a stopper for prohibiting forward and backward movement beyond a stroke range.

The above-mentioned carrier module according to the present invention provides advantages in that the carrier module enables an easy fixing of various kinds of the IC devices 100 and easy assemblage.

Figure 6:
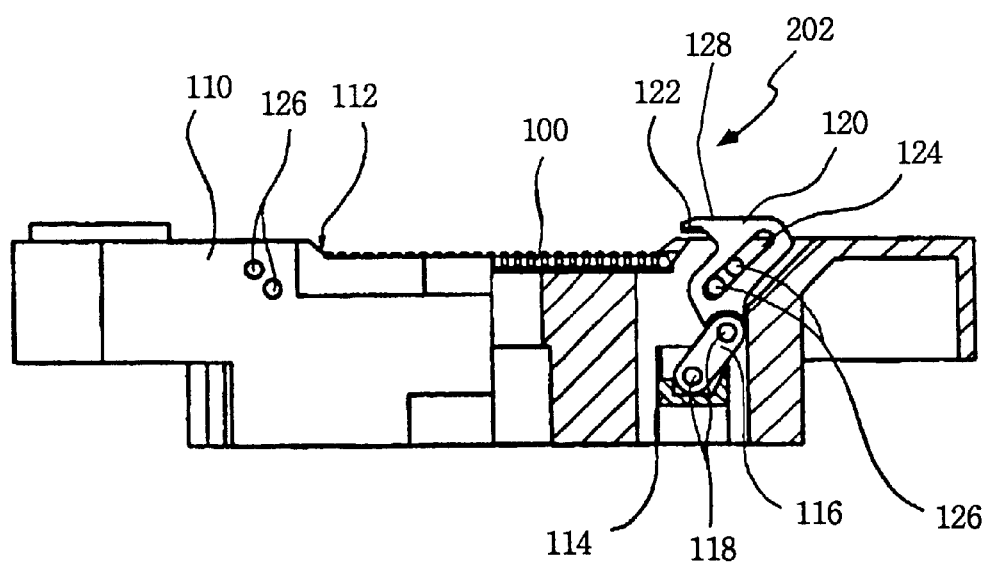
FIG. 6 is a sectional view showing a state before a latch of a carrier module holds an IC device according to another embodiment of the present invention.
Figure 7:
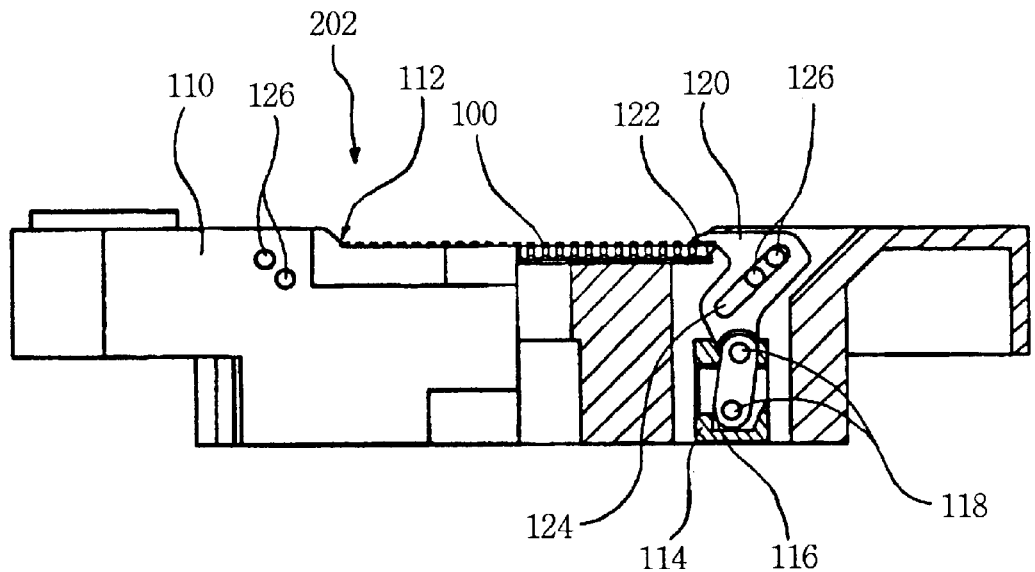
FIG. 7 is a sectional view showing a state where a latch of a carrier module holds an IC device according to another embodiment of the present invention.

Referring to FIGS. 6 and 7, a carrier module 202 according to another embodiment of the present invention will be described. A body 110 has a central portion thereof as a seat 112 on which an IC device is seated. At both sides of the body 110, there are at least one or more latches 120 for fixing the IC device 100 and having a predetermined portion thereof in which an elongate hole 124 is formed. The elongate hole 124 has an inside thereof provided with a pair of guide means 126 functioning to permit a movement of the latch 120 by a constant range of stroke.

A connecting pin 118 connects one end of the latch 120 to a connecting piece 116 inserted into a support block 114, and is fixed to the support block 114, thereby being moved in a predetermined direction.

As shown in FIG. 7, the support block 114 in a lower position allows the connecting piece 116 to pull the latch 120, thus leads to the fixing of the IC device 100. The guide means 126 are positioned in upper side of the elongate hole 124 formed in the latch 120, which means that the latch 120 is in a fixed position. The guide means 126 may consist of a pair of guide pins 126, or a single guide member 144 (see FIG. 11).

Figure 8:
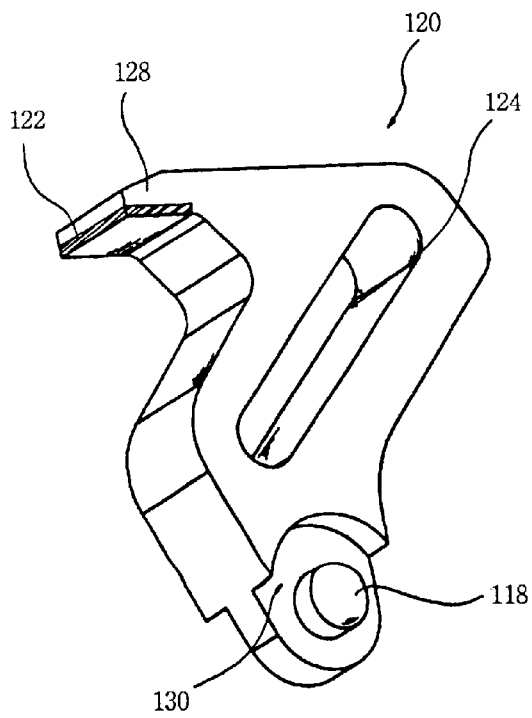
FIG. 8 is a perspective view of a latch as a main port of the present invention.

On the other hand, as shown in FIG. 8, the latch 120 has a central portion thereof provided with the elongate hole 124, and one side thereof forming a tip 128, the tip being used to fix the IC device 100 and having lower portion provided with a buffer member 122 made of, for example, a silicone rubber material. The latch 120 also has a lower portion 130 in which the connecting pin 118 is formed to be coupled to upper portion of the connecting piece 116 (see FIG. 9).

Figure 9:
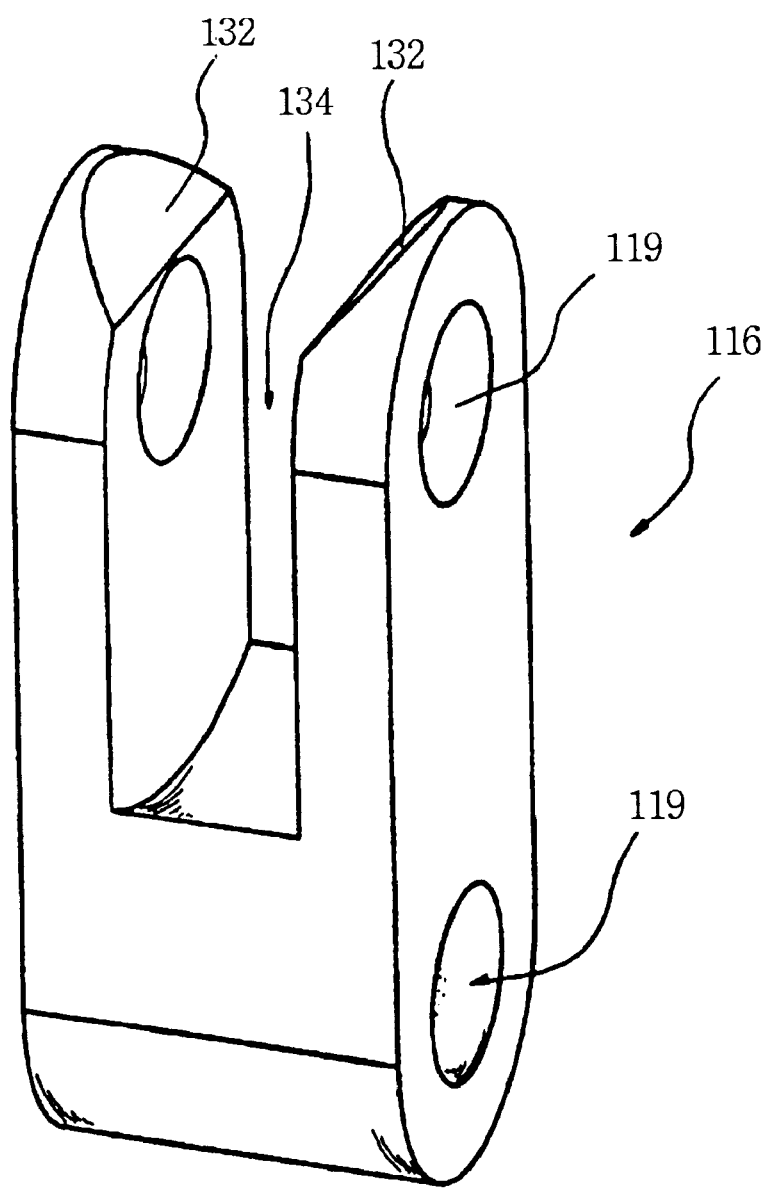
FIG. 9 is a perspective view of a connecting piece as a main port of the present invention.

As shown in FIG. 9, the connecting piece 116 is generally U-shaped. Slant portions 132 are formed on upper portion f the connecting piece 116 for an abrasion protection against the latch 120. Predetermined portions of the connecting piece 116 have a plurality of through holes 119. Reference numeral 134 denotes an insertion portion.

Figure 10:
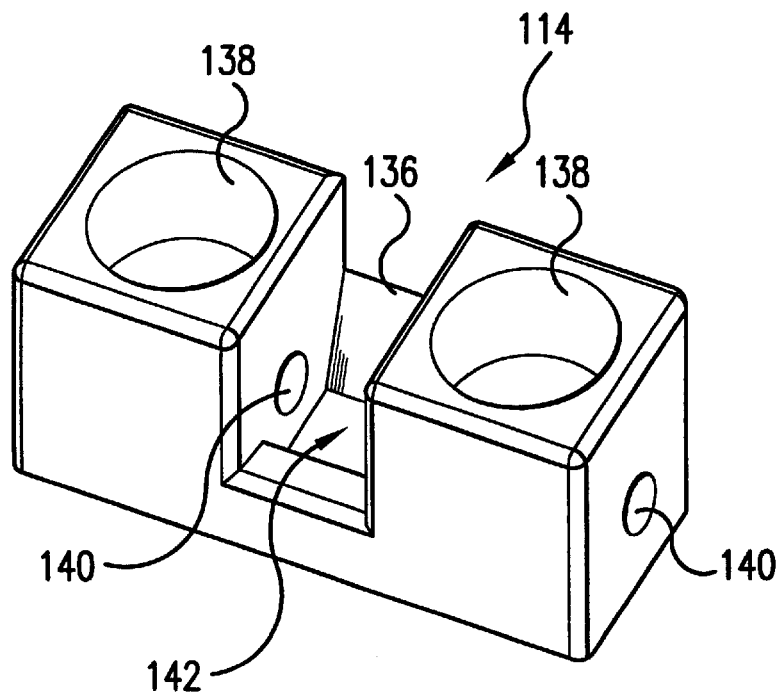
FIG. 10 is a perspective view of a support block as a main port of the present invention.

FIG. 10 is a perspective view showing the support black applied to another embodiment of the present invention. The support block 114 has a central portion thereof in which an insertion portion 142 is formed such that the connecting piece 116 is inserted, wherein the insertion portion 142 has front and back surfaces 136 slanted and both side surfaces thereof provided with through holes 140, respectively. Both sides of the insertion portion 142 are provided with holes 138, respectively. The through holes 140 communicate with the through holes 119 formed in the lower portion of the connecting pin 116, by means of the connecting pine 118.

Figure 11:
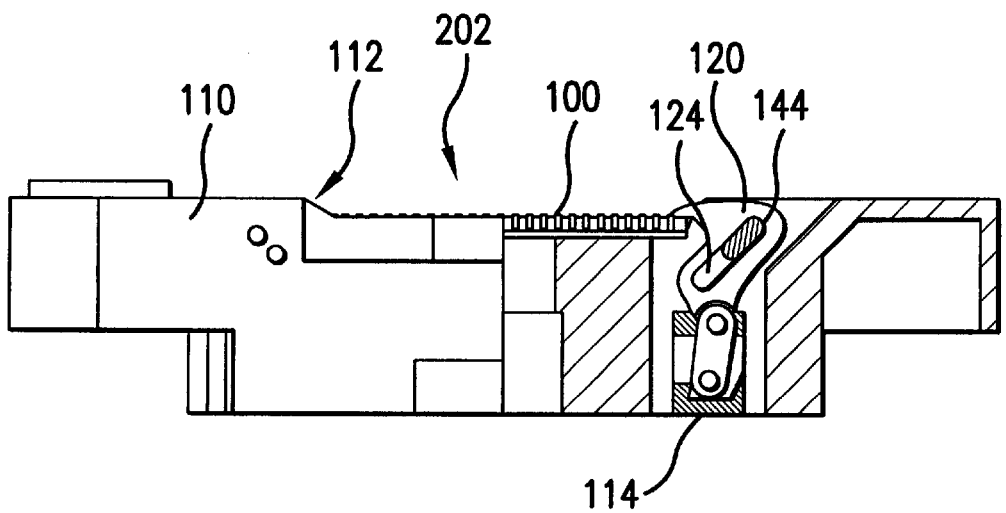
FIG. 11 is a sectional view of the case where a guide member is used instead of a guide pin according to another embodiment of the present invention.

FIG. 11 shows that the guide member 144 is applied instead of using the pair of guide means, but the construction and operation thereof are similar to the foregoing description, and therefore the detailed explanation therefor will be omitted.

For the carrier module 202 implemented by another embodiment of the present invention, the latch 120 for fixing the IC device 100 is moved to upward/downward positions by the support block 114, and at the time of being moved, the elongate hole 124 formed in the latch 120 cooperates with the guide member 144, to fix or release the IC device.

As shown in FIG. 6, simultaneously with the upward movement of the support block 114 to the upper position, the connecting piece 116 being also moved upward is tilted to a right side and raised. At this time, the connecting piece 116 pushes up the latch 120. When the connecting piece 116 raises and pushes up the lower portion of the latch 120, the latch 120 guided by the guide means 126 is elevated to release the IC device 100 having been fixed.

In contrast, as shown in FIG. 7, by the downward movement of the support block 114, the connecting piece 116 being connected the latch 120 becomes pulled downward, and simultaneously therewith, the latch 120 is also pulled and fixes the IC device.

The carrier module according to another embodiment of the present invention provides advantage in that since the guide means is moved along the elongate hole formed in the latch and a constant distance of the stroke in the movement is thereby ensured, various thicknesses and sizes of the IC devices are handled without exchanging the carrier module with others.

What is claimed is:

1. A carrier module comprising:

a body having an insertion groove formed therein in a predetermined direction and a plurality of holes;

a pair of plate-shaped springs inserted and fixed in the insertion groove for elastic movement upward and downward;

a pair of latches respectively installed on upper portions of the plate-shaped springs for fixing an IC device to the body under a bias force respectively established by said plate-shaped springs, each of the latches having a jaw for contacting the IC device, an upper button extending behind the jaw, and a lower button disposed underneath the jaw and extending therefrom; and a pair of pins for respectively pivotally fixing the latches, the pins being inserted and fixed into the body, wherein the IC device is fixed by operation of the latches under the bias force of the plate-shaped springs and released by application of a force sufficient to overcome the bias force to a selected one of the upper and lower buttons.

2. A carrier module comprising:

a body having a guide formed adjacent each of two ends thereof;

a pair of latches for fixing or releasing an IC device which is displaceably seated on the body, each of the pair of latches having an elongated hole formed through a central portion thereof and receiving respective guide therein to limit displacement of the latch, a connecting pin extending from a lower portion of the latch, and a tip portion formed on an opposing end of the latch;

a pair of buffer members respectively coupled to a lower surface of said tip portions of the latches, each of the buffer members being formed of an elastic material;

a pair of connecting pieces pivotally connected to the connecting pin of a respective one of the latches, each of the connecting pieces being adapted to move together with the movement of the latch; and a pair of support blocks respectively pivotally coupled to the connecting pieces, each of the support blocks being configured to move the connecting piece upward and downward and thereby displace the latch to disengage and engage the corresponding tip with the IC device, each support block functioning as a button operated from a lower side of the body to displace the corresponding latch.

3. The carrier module according to claim 2, wherein the buffer member is made of a silicone rubber.

* * * * *